United States Patent
Mossavat et al.

(10) Patent No.: US 11,556,060 B2
(45) Date of Patent: Jan. 17, 2023

(54) METHOD OF CALIBRATING A PLURALITY OF METROLOGY APPARATUSES, METHOD OF DETERMINING A PARAMETER OF INTEREST, AND METROLOGY APPARATUS

(71) Applicant: ASML Netherlands B.V., Veldhoven (NL)

(72) Inventors: Seyed Iman Mossavat, Waalre (NL); Bastiaan Onne Fagginger Auer, Eindhoven (NL); Remco Dirks, Deurne (NL); Alexandru Onose, Eindhoven (NL); Hugo Augustinus Joseph Cramer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 560 days.

(21) Appl. No.: 16/556,637

(22) Filed: Aug. 30, 2019

(65) Prior Publication Data

US 2020/0110341 A1    Apr. 9, 2020

(30) Foreign Application Priority Data

Oct. 9, 2018  (EP) .................................... 18199371

(51) Int. Cl.
  *G03F 7/20* (2006.01)
  *G05B 13/02* (2006.01)
  *H01L 21/66* (2006.01)

(52) U.S. Cl.
  CPC ...... *G03F 7/70516* (2013.01); *G03F 7/70625* (2013.01); *G03F 7/70633* (2013.01);
  (Continued)

(58) Field of Classification Search
  CPC ............. G03F 7/70516; G03F 7/70625; G03F 7/70633; G03F 7/70525; G03F 7/705;
  (Continued)

(56) References Cited

U.S. PATENT DOCUMENTS 6,952,253 B2  10/2005  Lof et al.
7,394,554 B2   7/2008  Vuong et al.
(Continued)

FOREIGN PATENT DOCUMENTS

EP  1628164 A2  2/2006
EP  3279737 A1  2/2018
(Continued)

OTHER PUBLICATIONS

"Autoencoder", Wikipedia, https://en.wikipedia.org/wiki/Autoencoder, accessed on Sep. 26, 2018; 6 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Methods for calibrating metrology apparatuses and determining a parameter of interest are disclosed. In one arrangement, training data is provided that comprises detected representations of scattered radiation detected by each of plural metrology apparatuses. An encoder encodes each detected representation to provide an encoded representation, and a decoder generates a synthetic detected representation from the respective encoded representation. A classifier estimates from which metrology apparatus originates each encoded representation or each synthetic detected representation. The training data is used to simultaneously perform, in an adversarial relationship relative to each other, a first machine learning process involving the encoder or decoder and a second machine learning process involving the classifier.

19 Claims, 7 Drawing Sheets

(52) U.S. Cl.
CPC ............ *G05B 13/027* (2013.01); *H01L 22/12* (2013.01); *G06V 2201/06* (2022.01)

(58) Field of Classification Search
CPC ....... G05B 13/027; H01L 22/12; H01L 22/14; H01L 22/24; H01L 22/20; H01L 22/34; G06V 2201/06; G06T 7/001; G06T 7/0004; G01N 21/9501
See application file for complete search history.

(56) References Cited

U.S. PATENT DOCUMENTS

| | | | |
|---|---|---|---|
| 10,502,694 | B2 | 12/2019 | Dziura et al. |
| 2007/0268497 | A1 | 11/2007 | Stanke et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2017/0045356 | A1* | 2/2017 | Pandev ............... G01B 21/042 |
| 2017/0193680 | A1 | 7/2017 | Zhang et al. |
| 2017/0345140 | A1* | 11/2017 | Zhang ................ G06T 7/0004 |

FOREIGN PATENT DOCUMENTS

| | | |
|---|---|---|
| TW | 200523536 A | 7/2005 |
| TW | 201510518 A | 3/2015 |
| WO | WO 2009/029851 A1 | 3/2009 |
| WO | WO 2015/049087 A1 | 4/2015 |
| WO | WO 2017/205537 A1 | 11/2017 |

OTHER PUBLICATIONS

Bishop, Christopher M., "Pattern Recognition and Machine Learning", Springer, 2006; ISBN: 9780387310732; 758 pages.
Goodfellow, Ian J. et al., "Generative Adversarial Nets", (https://arxiv.org/abs/1406.2661), published on Jun. 10, 2014; 9 pages.
Zhang, Han et al., "StackGAN: Text to Photo-realistic Image Synthesis with Stacked Generative Adversarial Networks", (https://arxiv.org/abs/1612.03242), published on Aug. 5, 2017; 14 pages.
International Search Report and and Written Opinion of the International Searching Authority directed to related International Patent Application No. PCT/EP2019/072355, dated Sep. 23, 2019; 13 pages.

* cited by examiner

METHOD OF CALIBRATING A PLURALITY OF METROLOGY APPARATUSES, METHOD OF DETERMINING A PARAMETER OF INTEREST, AND METROLOGY APPARATUS

FIELD

The present invention relates to calibrating plural metrology apparatuses.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

It is desirable to make measurements of structures created in lithographic processes, e.g., for process control and verification. Various tools for making such measurements are known. Such tools may be referred to as metrology apparatuses.

Metrology apparatuses are known which rely on optical scatterometry. In such metrology apparatuses, an optical signal is obtained by measuring radiation scattered from a target. The optical signal may comprise intensity, phase, polarization, spectral information, or other optical properties. Parameters of interest describing properties of the target, such as overlay (OV), critical dimension (CD) or more complex shape parameters described structures of the target, are inferred from the optical signal. The optical signal is influenced by properties of the target and by properties of the metrology apparatus. It is necessary to distinguish between the two influences to determine the parameters of interest.

It is desirable to measure properties of the target consistently using different metrology apparatuses. This capability may be referred to as tool-to-tool matching. As Moore's law continues it is becoming increasingly difficult to achieve adequate tool-to-tool matching. This is particularly the case for sophisticated measurement modes, such as where different polarization modes or wide wavelength ranges are used, for small targets (e.g. 5×5 µm² targets), and for difficult use cases, such as where sensitivity is low and/or where multiple parameters of interest with correlated responses are being determined.

SUMMARY

It is an object of the invention to improve calibration of metrology apparatuses, for example in the context of tool-to-tool matching.

In an aspect of the invention there is provided a method of calibrating a plurality of metrology apparatuses, comprising: obtaining training data comprising, for each of the metrology apparatuses, a plurality of detected representations of radiation scattered from a structure on a substrate and detected by the metrology apparatus; providing an encoder configured to encode each detected representation to provide an encoded representation, and a decoder configured to generate a synthetic detected representation from the respective encoded representation; providing a classifier configured to estimate from which metrology apparatus originates each encoded representation or each synthetic detected representation; and using the training data to simultaneously perform: a first machine learning process in which either or both of the encoder and decoder are trained to 1) minimize differences between the detected representations and corresponding synthetic detected representations, and 2) minimize a probability of the classifier correctly identifying from which metrology apparatus originates each encoded representation or each synthetic detected representation; and a second machine learning process in which the classifier is trained to maximize the probability of the classifier correctly identifying from which metrology apparatus originates each encoded representation or each synthetic detected representation.

BRIEF DESCRIPTION OF THE DRAWINGS

Embodiments of the invention will now be described, by way of example only, with reference to the accompanying schematic drawings in which like reference numerals represent corresponding features, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
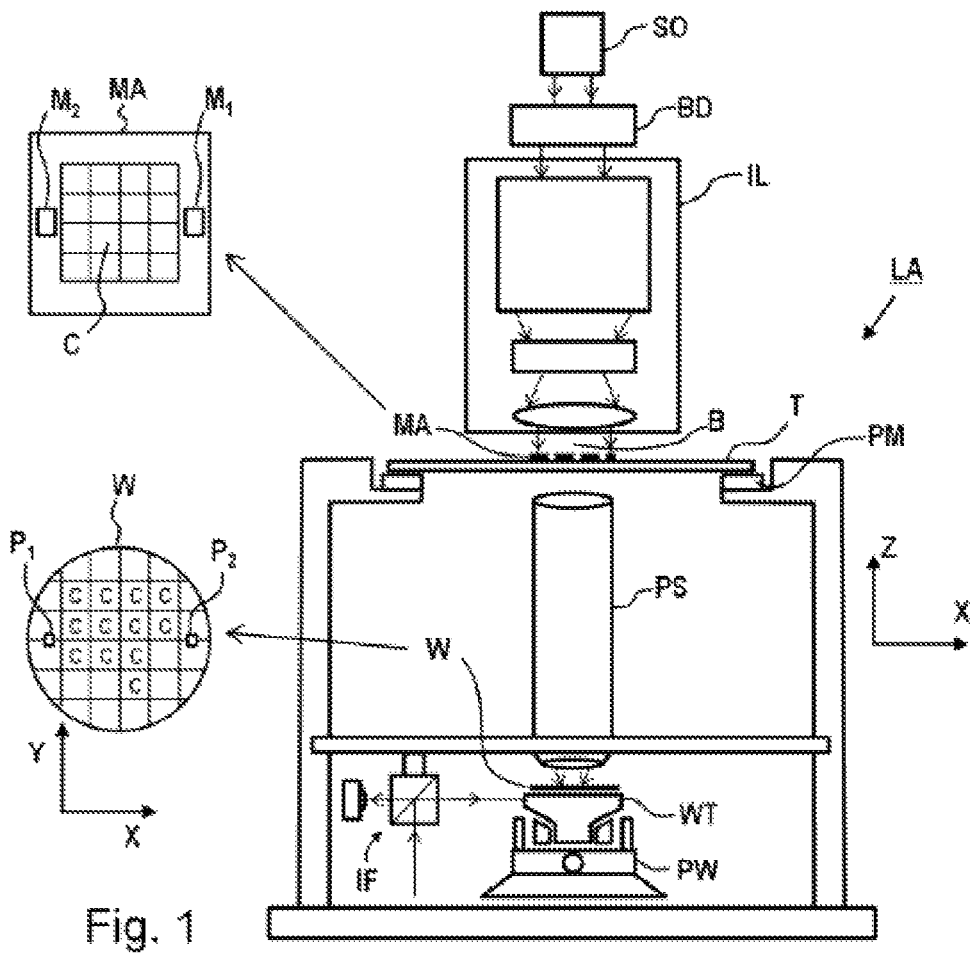
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
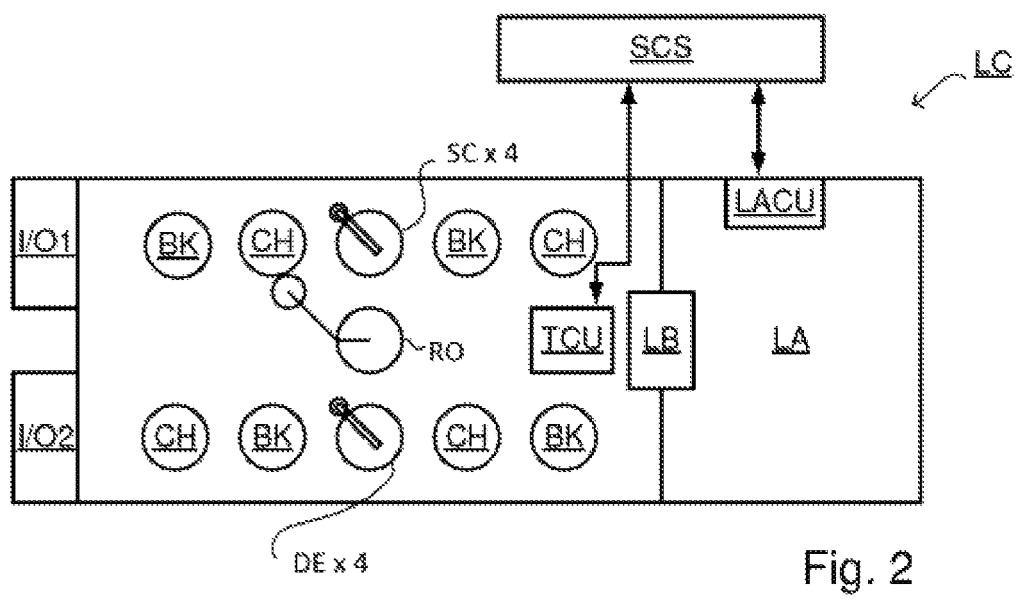
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

A metrology apparatus, which may also be referred to as an inspection apparatus, is used to measure properties of targets on substrates W, such as overlay error (OV), critical dimension (CD), or more complex shape parameters. The metrology apparatus may also be used to identify defects on the substrate W. The metrology apparatus may be provided as part of the lithocell LC, or may be integrated into the lithographic apparatus LA, or may even be a stand-alone device. The metrology apparatus may measure the properties using a latent image (image in a resist layer after the exposure), or using a semi-latent image (image in a resist layer after a post-exposure bake step PEB), or using a developed resist image (in which the exposed or unexposed parts of the resist have been removed), or even using an etched image (after a pattern transfer step such as etching). An output from the metrology apparatus may be used to make adjustments to exposures of subsequent substrates W or to other processing steps that are to be performed on the substrates W, especially if the inspection is done before other substrates W of the same batch or lot are still to be exposed or processed.

The metrology apparatus may comprise a scatterometer, whereby radiation scattered from a target on a substrate W is detected and analysed to obtain information about the target. The target measured by the scatterometer may be a dedicated metrology target or a portion of a device structure. The target may be underfilled (such that an illumination spot is smaller than the target) or overfilled (such that an illumination spot extends beyond the target).

The metrology apparatus may allow measurements of parameters of a lithographic process via a detector in a pupil plane of an objective of a scatterometer, or in a plane conjugate to the pupil plane. Such measurements may be referred to as pupil based measurements. A detected representation of scattered radiation may comprise a distribution of intensity or phase in the relevant plane. The detected representation may be referred to as a detected pupil representation or pupil image. Alternatively or additionally, a detector may be provided in an image plane, or in a plane conjugate to the image plane, in which case the measurements may be referred to as image or field based measurements. A detected representation of scattered radiation may comprise a distribution of intensity or phase in the relevant plane. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 3:
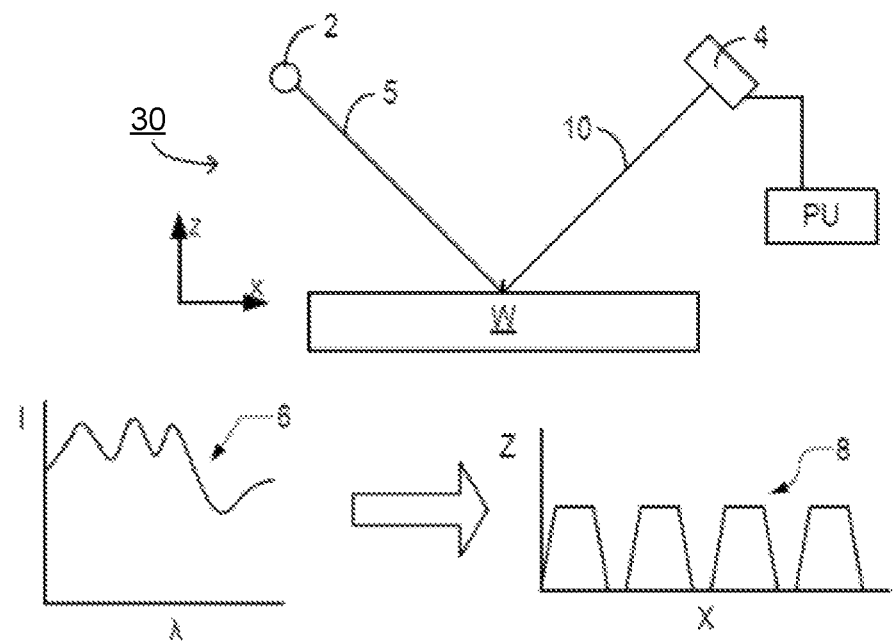
FIG. 3 depicts a schematic overview of a metrology apparatus.

An example of a metrology apparatus 30 comprising a scatterometer is depicted in FIG. 3. The metrology apparatus 30 comprises a radiation source 2 which projects radiation 5 onto a substrate W. The reflected or scattered radiation 10 is detected by a detector 4. In the example shown, the radiation source 2 is a broadband (white light) radiation projector and the detector 4 measures a spectrum 6 (i.e. intensity I as a function of wavelength k) of the specular reflected radiation 10. In other embodiments, different forms of radiation source and detector may be used. The scatterometer may be configured as a normal-incidence scatterometer or an oblique-incidence scatterometer.

The metrology apparatus 30 may be used in a model-based method, as depicted schematically in the lower part of FIG. 3. In a model-based method, a theoretical model is used to simulate interaction between radiation from the radiation source 2 and a structure 8 on the substrate W, and the process of detecting radiation by the detector 4. By adapting parameters in the model describing the structure 8 until a desired fit quality is achieved between a simulated detected representation at the detector 4 and an actual detected representation at the detector 4, it is possible to determine one or more parameters of interest of the structure 8. The determination of one or more parameters of interest in this way may be referred to as reconstruction. The reconstruction may be performed using a processing unit PU. In an embodiment, the reconstruction is performed using Rigorous Coupled Wave Analysis and non-linear regression or by comparison with a library of simulated detected representations (e.g. simulated spectra in the example shown in FIG. 3). In general, for the reconstruction, the general form of the structure 8 is known and some parameters are assumed from knowledge of the process by which the structure 8 was made, leaving only a relatively small number of parameters of the structure 8 to be determined from measurements performed by the metrology apparatus 30.

The metrology apparatus 30 may be used in a data-driven method. Data-driven methods use a direct regression from raw signals obtained by the detector 4 to one or more parameters of interest. A regression function may be trained using targets having known variations of the one or more parameters of interest, based on some ground truth data. The ground truth data may, for example, be derived using measurements of the target properties with a reference tool such as a scanning electron microscope (SEM), or by inducing a known variation of target properties over the substrate W during the process of creating the substrate W, e.g. by programmed offsets in overlay set values or by reticle writing offsets.

Three technical concepts are now described as background useful for understanding the present disclosure: 1) an autoencoder; 2) a Generative Adversarial Network (GAN); and 3) normalization.

An auto-encoder is a neural network that is used for nonlinear dimensionality reduction, similar to principle component analysis (PCA) and for generative modeling.

Figure 4:
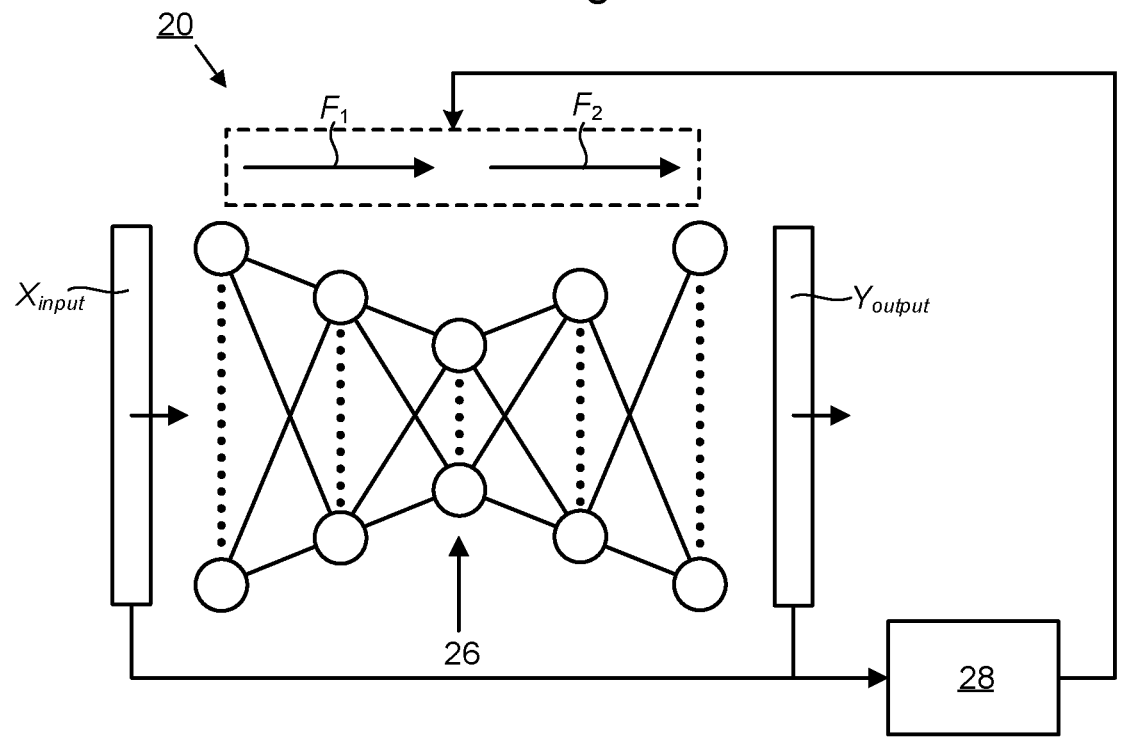
FIG. 4 depicts an autoencoder.

An example structure of an autoencoder 20 is depicted in FIG. 4. The autoencoder 20 consists of a multilayer neural network where the dimensionality of the output, $Y_{output}$, is identical to the dimensionality of the input $X_{input}$ and where one of the hidden layers has a lower dimensionality, acting as an information bottleneck. For simplicity only a small number of layers and neurons are depicted in FIG. 4. $F_1$ is a portion of the neural network which may be referred to as an encoder. $F_2$ is a portion of the neural network which may be referred to as a decoder. The innermost layer 26 has fewer neurons and is acting as the information bottleneck. The innermost layer 26 captures a concise description of the input $X_{input}$. The innermost layer 26 can thus be used to provide a dimensionality reduced representation of the input $X_{input}$. The autoencoder 20 is trained such that the output $Y_{output}$ is a close match to the input $X_{input}$. The training process thus involves comparisons between the input $X_{input}$ and the output $Y_{output}$, depicted schematically by block 28, and feedback to either or both of the encoder $F_1$ and decoder $F_2$.

Unsupervised training ensures that the autoencoder 20 reproduces the essential input information at the output $Y_{output}$, by minimization of the difference:

$$F_1, F_2 = \underset{F_1, F_2}{\mathrm{argmin}} \|X_{input} - F_2(F_1(X_{input}))\|^2$$

To regularize the cost function, an additional term can be added term that penalizes the class of possible functions $F_1$ and $F_2$. Since the information still has to pass through the innermost layer 26, the innermost layer 26 should contain sufficient statistics needed for the reproduction of the data.

GANs are typically used to generate artificial data that strongly resembles the properties of a reference set of data. GANs consist of two modules, typically two neural networks. One neural network will generate synthetic data and the second neural network will evaluate the output of the first neural network to try to classify whether its input data is generated by the generative model (first neural network) or is coming from a reference set, e.g. an actual physical process. These two models can be trained jointly, in a competitive mode: the goal of the generative model is to deceive the classifier. By becoming good at it, the generative model will learn what the actual data should look like such that the classifier cannot discriminate the synthetic data from the real data. The classifier on the other side tries to tell the real data and the synthetic data apart. By training of the classifier, the classifier will increase its ability to detect any statistical difference between the two sources of data.

Raw measurement signals from a metrology apparatus 30 can be normalized to remove or reduce influences on the raw measurement signals from the metrology apparatus 30. The simplest form of normalization is using a reference branch to determine the intensity of the radiation source 2 used to illuminate the substrate W. More advanced methods use a reference substrate, with known reflectivity, to track changes in optics of the metrology apparatus 30.

Another normalization method is the trace normalization in the Jones framework used, for example, for model-based reconstruction. In this method, for every pixel in a detected representation obtained by the detector 4 (e.g. an optical image), the (squared Jones) matrices $M_{out}$ and $\rho_{in}$ specify the calibration state of the metrology apparatus 30 for an outgoing and incoming branch of optics of the metrology apparatus 30, respectively. The detected representation is modeled as the trace of the matrix multiplication of these matrices with the reflection Jones matrix of the target at this pixel. As an approximation, the measured intensity $I_m$ can be normalized by $tr(M_{out} R_{mirror} \rho_{in} R_{mirror}^H)$, with $$R_{mirror} = \begin{pmatrix} -1 & 0 \\ 0 & -i \end{pmatrix}$$

the reflectivity of a perfect mirror. This trace corresponds to the expected detected representation (signal) image intensity of a perfect mirror measured with the metrology apparatus with this calibration state. The detected representation (signal) measured from the target can be normalized with this trace as follows:

$$\tilde{I}_n = \frac{I_m}{tr(M_{out} R_{mirror} \rho_{in} R_{mirror}^H \rho_{in})}$$

For metrology systems which output two detected representations (signals), one co-polarized and one cross-polarized, the normalization can be adapted, using the sum of co-pol and x-pol traces, to avoid division by zero.

The trace normalization in the Jones framework removes effects such as radiation source intensity fluctuation transmission variation in optics of the metrology apparatus 30, but cannot fully compensate for polarizing effects of the detector optics as these cannot be divided out at intensity level. (This is in contrast to the model-based inference, which is able to take such effects into account, provided the metrology apparatus 30 is calibrated accurately.) Therefore, even after normalization of the raw detected representation from the target, the 'calibration signals' measured on the reference targets, and the reference branch signal, depicting the illumination source, will remain important as a source of information on the actual state of the metrology apparatus 30.

As discussed in the introductory part of the description, it is desirable to measure properties of a target on a substrate W consistently using plural different metrology tools, which may be referred to as tool-to-tool matching. In the case of model-based methods, matching can be improved by calibration of parameters of a model describing properties of the detector 4 on each metrology apparatus 30 separately, using measurements on calibration targets with well-known properties. In the case of data-driven methods, matching can be improved by retraining (parts of) the regression function on each metrology apparatus 30, using a golden training substrate, or using targets printed in a scribe lane of each substrate W. Alternatively, matching may be improved using pragmatic methods to remove most of the influence of the metrology apparatus 30 on the detected representations, e.g. by substrate rotation to remove detector asymmetries, and/or by normalization of detected representations by a reference signal that has a similar response to some of the properties of the metrology apparatus 30 (e.g. a detected representation from a reference branch, a symmetric part of a detected representation, or a co-polarized detected representation). The following embodiments describe methods of calibration which aim to make achieving adequate tool-to-tool matching easier or to extend the precision of tool-to-tool matching further than is currently possible without excessive measurement time or computing resource.

Figure 5:
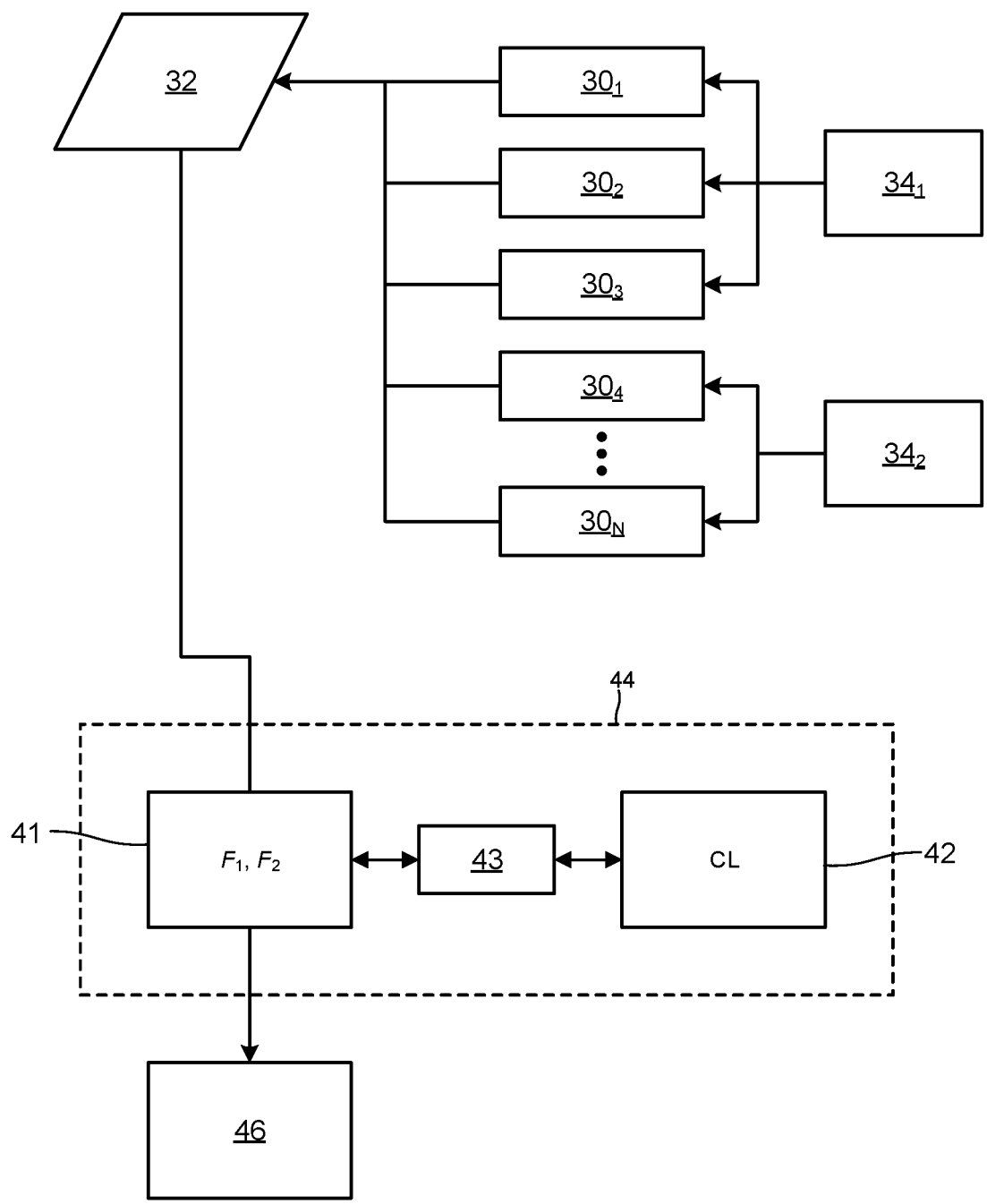
FIG. 5 depicts a method of calibrating a plurality of metrology apparatuses according to an embodiment.

FIG. 5 depicts a method of calibrating a plurality of metrology apparatuses $30_1$-$30_N$ to achieve tool-to-tool matching. The method comprises obtaining training data 32. The training data 32 comprises, for each of the metrology apparatuses $30_1$-$30_N$, a plurality of detected representations of radiation scattered from a structure on a substrate W and detected by the metrology apparatus $30_1$-$30_N$. The training data 32 thus comprises multiple metrology apparatus specific data sets. Each detected representation may comprise one or more of the following: an intensity distribution in a pupil plane or conjugate thereof, a phase distribution in a pupil plane or conjugate thereof, an intensity distribution in an image plane or conjugate thereof, a phase distribution in an image plane or conjugate thereof.

In an embodiment, the training data 32 is obtained by measuring the same substrate W or set of substrates W with all of the multiple metrology apparatuses $30_1$-$30_N$ to be matched. In the example shown, the training data 32 is obtained by performing metrology measurements on two different sets $34_1$ and $34_2$ of substrates. Metrology apparatuses $30_1$-$30_3$ contribute to the training data 32 by measuring substrates W in substrate set $34_1$ and metrology apparatuses $30_4$-$30_N$ contribute to the training data 32 by measuring substrates W in substrate set $34_2$. Although it is not necessary for the metrology apparatuses $30_1$-$30_N$ to measure the same substrate W or set of substrates W, it is desirable for the different metrology apparatuses $30_1$-$30_N$ to measure a representative sample of substrates W that have been subjected to a given type of lithographic process within a given time frame. In an embodiment, each metrology apparatus $30_1$-$30_N$ measures a statistically similar distributions of substrates W (not necessarily the same substrates W) that sample processing by each and every one of the same set of processing tools (e.g. scanners, etchers, etc.). Notwithstanding the above, it is also possible to measure the same set of substrates W with all of the metrology apparatuses $30_1$-$30_N$ being matched. This ensures that each metrology apparatus $30_1$-$30_N$ sees an identical distribution. This approach may be desirable where it is possible to keep a set of substrates W for calibration purposes only. This may not be practical where there are substrates W that will deteriorate during storage. In a modern high-volume manufacturing environment, the statistical distribution of substrate properties is likely not to change greatly over time, which means that the burden of storing so-called holy (reference) substrates W could be omitted.

The contribution to the training data 32 from each metrology apparatus $30_1$-$30_N$ may comprise one or more of the following: non-normalized detected representations (e.g. intensity and/or phase information in a pupil or image plane, or conjugate thereof), normalized detected representations (e.g. detected representations processed as described above to remove a portion of the influence on the detected representations from the metrology apparatus), and calibration data (e.g. matrices $M_{out}$ and $\rho_{in}$).

An encoder $F_1$ is provided. The encoder $F_1$ encodes each detected representation to provide an encoded representation. A decoder $F_2$ is provided. The decoder $F_2$ generates a synthetic detected representation from the respective encoded representation.

A classifier CL (exemplified in FIGS. 6-9 and discussed below) is provided. The classifier CL estimates from which metrology apparatus $30_1$-$30_N$ originates each encoded representation or each synthetic detected representation.

The classifier CL and either or both of the encoder $F_1$ and the decoder $F_2$ are parameterized, which allows them to be trained (by adjustment of one or more of the parameters to improve their respective performance). The encoder $F_1$ depends on parameters $\theta_1$ and maps an input x (comprising a detected representation) to a latent space code $z=F_1(x, \theta_1)$. The latent space code z comprises an encoded representation of a detected representation from a metrology apparatus $30_1$-$30_N$. The decoder $F_2$ depends on parameters $\theta_2$ and maps the code z to an output $y=F_2(z, \theta_2)$ (comprising a synthetic detected representation). The decoder $F_2$ acts as a generative model to provide the synthetic detected representation. The output y provides the synthetic detected representation in such a way that an influence from the metrology apparatus 30 is reduced relative to the detected representation of the input x. The extent to which the influence is suppressed is judged by the classifier CL.

The training data 32 is used to simultaneously perform a first machine learning process 41 and a second machine learning process 42.

In the first machine learning process 41, either or both of the encoder $F_1$ and decoder $F_2$ are trained to 1) minimize differences between the detected representations and corresponding synthetic detected representations, and 2) minimize a probability of the classifier CL correctly identifying from which metrology apparatus $30_1$-$30_N$ originates each encoded representation or each synthetic detected representation.

In the second machine learning process 42, the classifier CL is trained to maximize the probability of the classifier CL correctly identifying from which metrology apparatus $30_1$-$30_N$ originates each encoded representation or each synthetic detected representation.

The output 46 from the training process provides an encoder $F_1$ and/or decoder $F_2$ that can process detected representations obtained from different metrology apparatuses $30_1$-$30_N$ with an optimized balance between fidelity and confusion, where fidelity represents the extent to which the output y retains information about the target, and confusion represents the extent to which the output y from different metrology apparatuses $30_1$-$30_N$ is indistinguishable. In an embodiment, a maximization of fidelity and confusion is achieved by optimizing a cost function 43. An example mathematical form of a suitable cost function 43 is described below with reference to the embodiment of FIG. 6.

Optimization based on the cost function 43 improves the classifier CL to identify the correct metrology apparatus $30_1$-$30_N$, while the encoder $F_1$ and/or decoder $F_2$ are updated to both confuse the classifier CL and preserve information of interest in the input x. The cost function 43 ensures that the first machine learning process 41 competes with the second machine learning process 42. The relationship between the first machine learning process 41 and the second machine learning process 42 may thus be described as adversarial. In some embodiments, the combination of the first machine learning algorithm 41 and the second machine learning algorithm 42 is implemented as a generative adversarial network (GAN) 44, with the first machine learning process 41 being adversarial with respect to the second machine learning process 42, and the decoder $F_2$ acting as a generative model of the GAN 44.

Various different encoder/decoder combinations may be used.

In one class of embodiments, the encoder $F_1$ and decoder $F_2$ comprise a neural network. The neural network may comprise an autoencoder. In this case, the encoder $F_1$ may be given by a neural network with input neurons equal to the dimensionality of the input x and (fewer) output neurons equal to the dimensionality of z, and any kind of neural network architecture in between. $\theta_1$ consists of the parameters of the neural network describing $F_1$, e.g., the weights and biases of this neural network. z is the compressed intermediate representation of the input x produced by encoder $F_1$. The decoder $F_2$ is given by a neural network with input neurons equal to the dimensionality of z and (more) output neurons equal to the dimensionality of the output y, and any kind of neural network architecture in between. $\theta_2$ consists of the parameters of the neural network describing the decoder $F_2$, e.g., the weights and biases of this neural network.

In an embodiment, the autoencoder is a variational autoencoder neural network. In this case, the encoder $F_1$ is given by a neural network with input neurons equal to the dimensionality of the input x and (fewer) output neurons equal to the dimensionality of z, and any kind of neural network architecture in between. $\theta_1$ consists of the parameters of the neural network describing the encoder $F_1$, e.g., the weights and biases of this neural network.

For a variational auto-encoder, z parameterizes a random distribution of possible codes (e.g., mean and covariance matrix of a Gaussian distribution in code space), instead of a single code. The decoder $F_2$ is given by a neural network with input neurons equal to the dimensionality of the codes sampled from the distribution parameterized by $F_1(x)$ and (more) output neurons equal to the dimensionality of the output y, and any kind of neural network architecture in between. $\theta_2$ consists of the parameters of the neural network describing the decoder $F_2$, e.g., the weights and biases of this neural network.

In an alternative embodiment, the encoder $F_1$ and decoder $F_2$ comprise a parametrized filter. The parametrized filter can be applied to an input x comprising diffraction efficiencies. The encoder $F_1$ may be defined as $F_1(x)=\Theta U^+ x$, where x is a detected representation comprising a detected pupil representation (e.g. an intensity distribution in the pupil plane or conjugate plane), U is a matrix consisting of basis vectors in the pupil (e.g., an orthogonal matrix consisting of principle component analysis (PCA) components or Zernike modes in the pupil or a general matrix such as the pseudo-inverse of an independent component analysis (ICA) unmixing matrix), $U^+$ denotes the Moore-Penrose pseudo-inverse of the matrix U, and $\Theta$ is a diagonal matrix weighting each of the coefficients of x w.r.t. the basis U. $\theta_1$ consists of the diagonal of $\Theta$, i.e., the weighting coefficients to be applied to each component or mode. $\Theta$ is thus a parametrized filter, parameterized by the parameters $\theta_1$. For example, picking each $\Theta_{ii} \in [0, 1]$ and decreasing with increasing frequency of the i-th column of U, e.g., higher frequency Zernike modes, will create a low-pass filter on the pupil. z is the list of coefficients of the input detected representation (e.g. detected pupil representation) w.r.t. the basis U, weighted by the parameterized filter Θ (e.g., weighted Zernike coefficients). The decoder $F_2$ may be defined as $F_2(z)=U\,z$, and expand the weighted coefficients with respect to the basis U again for the full pupil. $\theta_2$ is empty in this example, although it is also possible to perform the coefficient weighting in the decoder $F_2$. Thus, in embodiments of this type, the training of the first machine learning process 41 comprises adjusting weightings applied by the encoder $F_1$ to respective components of a mathematical expansion (e.g. PCA, ICA, Zernike) weighted by the weightings. In such embodiments, the encoded representation z comprises coefficients of the mathematical expansion weighted by the weightings. Alternatively or additionally, the training of the first machine learning process 41 may comprise selecting one or more basis functions of a mathematical expansion (e.g. PCA, ICA, Zernike) representing the detected representation. Thus, a particular sub-set of available basis components may be selected so as to achieve improved tool-to-tool matching. The basis used for the encoder $F_1$ may be the same or different as the basis used for the decoder $F_2$.

In an embodiment, the encoding of each detected representation by the encoder $F_1$ comprises deriving one or more parameters of interest of the structure on the substrate W from which the detected representation is obtained by the respective metrology apparatus $30_1$-$301_N$. For example, the encoder $F_1$ may infer one or more parameters of interest using a data-driven method, for example as described above, with a data-driven recipe parameterized by $\theta_1$.

In an embodiment, the encoder $F_1$ derives one or more target parameters of a geometrical model of the structure on the substrate W and the decoder $F_2$ simulates scattering of radiation from the structure and detection of the detected representation by the metrology apparatus $30_1$-$301_N$ based on the geometrical model of the structure and a metrology recipe defining settings of the metrology apparatus $30_1$-$301_N$. Thus, the encoded representation z may comprise reconstructed geometrical dimensions of the geometrical model, e.g., critical dimension, side wall angle, overlay, etc. In such an embodiment, the training of the first machine learning process 41 may comprise adjusting parameters (e.g., material parameters, nominal stack dimensions, fix/float, etc.) defining the geometrical model (i.e. the geometrical model is parametrized by $\theta_1$) and/or adjusting one or more parameters defining the metrology recipe (i.e. the metrology recipe is parametrized by $\theta_1$).

In an embodiment, the classifier CL maps an output of the encoder $F_1$, decoder $F_2$, or both, to a probability per metrology apparatus $30_1$-$30_N$ that the output originated from a particular metrology apparatus $30_1$-$30_N$. The classifier CL may be implemented in a variety of different ways, including any one or more of the following: neural network (e.g., with a softmax final layer yielding probabilities per metrology apparatus); support vector machine; logistic regression; (kernel) linear discriminant analysis.

Figure 6:
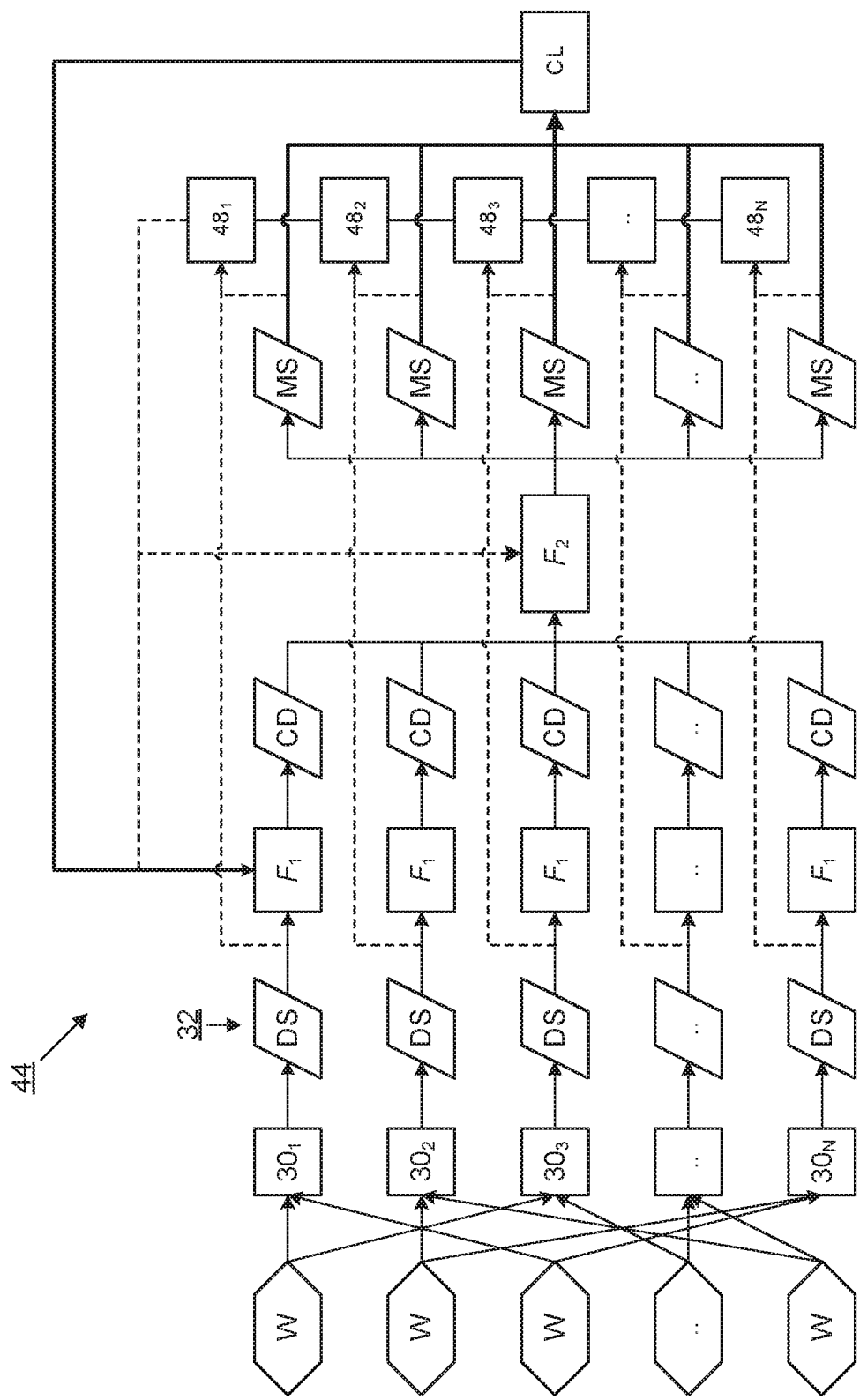
FIG. 6 depicts an example adversarial network having multiple encoders and a shared decoder.

FIG. 6 depicts data flow in a detailed example of a method of calibrating the plurality of metrology apparatuses $30_1$-$30_N$. In this example, training data 32 is provided by measuring a plurality of substrates W with a plurality of metrology apparatuses $30_1$-$30_N$. Datasets DS, which may be normalized as described above, are supplied, optionally together with calibration data, to encoders $F_1$ of an autoencoder network. Encoded representations CD output from the encoders $F_1$ are supplied to a single, shared decoder $F_2$. The shared decoder $F_2$ outputs a plurality of datasets MS corresponding respectively to the plurality of metrology apparatuses $30_1$-$30_N$. Each dataset MS comprises a synthetic detected representation generated by decoding a respective encoded representation.

Two competing training mechanisms (the first machine learning process 41 and the second machine learning process 42) are used to optimize the network 44. In this example, one comparator $48_1$-$48_N$ is provided per encoder $F_1$. The comparators $48_1$-$48_N$ compare the datasets DS input to the encoders $F_1$ with the datasets MS output from the decoder $F_2$ and provides feedback to adjust parameters defining the encoders $F_1$ to optimize the cost function 43 (see broken line data paths) and thereby attempt to maximize the preservation of information in the datasets MS relative to the datasets DS. The classifier CL also receives the datasets MS from the decoder $F_2$ and will be trained to optimize the cost function 43 and thereby attempt to maximize the probability of the classifier CL classifying each dataset MS to the correct corresponding metrology apparatus $30_1$-$30_N$. Data flow for training of the classifier is indicated by thick solid lines.

Using the probability that the classifier CL can discriminate the different metrology apparatuses $30_1$-$30_N$ as a penalty in the cost function 43 forces the autoencoder to represent the information such that the classifier CL cannot properly classify it. The overall cost function 43 and the optimization problem may be as follows (excluding terms to regularize neural network training):

$$\arg\min_{F_1^m, F_2} \max_{CL} \sum_{X_i^m} \{\|X_i^m - F_2(F_1^m(X_i^m))\|^2 + \alpha \log[p_m^{CL}(F_2(F_1^m(X_i)))]\}$$

where
$X_i^m$ is a dataset, measured on metrology apparatus m;
$p_m^{CL}(x)$ is the probability that classifier CL assigns that the input x belongs metrology apparatus m;
$F_1^m$ is the encoder corresponding to metrology apparatus m and $F_2$ is the shared decoder; and
the coefficient $\alpha > 0$ defines a trade-off between preserving measurement data fidelity and removing machine-specific pupil characteristics.

After the first machine learning process 41 and the second machine learning process 42 have been trained in an initial phase, the training can be updated to take account of addition of further metrology apparatuses or new applications.

In an embodiment, a new metrology apparatus is added to the population of metrology apparatuses without retraining parts of the first machine learning process 41 and the second machine learning process 42 that have already been trained in respect of existing metrology apparatuses, thereby preventing negative impact on running processes. The addition of the new metrology apparatus may be performed, for example, by training only a new encoder $F_1$ corresponding to the new metrology apparatus and the classifier CL. In an embodiment, transfer-learning of the new encoder $F_1$ is performed, using the trained status of the existing encoders $F_1$ as a starting point. This approach is effective where properties of the new metrology apparatus do not deviate too significantly from the metrology apparatuses initially used to train the autoencoder (e.g. the new metrology apparatus should be from a population of metrology apparatuses with the same design and produced with the same or similar conditions). Moreover, the set of metrology apparatuses $30_1$-$30_N$ used for the initial training should be a representative sampling over the population of metrology apparatuses.

To cover multiple applications it is possible to perform the training of the first machine learning process 41 and the second machine learning process 42 separately per application. However, since the approach is application independent (no application information needs to be used to design or train the network 44), adding a new application could be done without adaptation or retraining. Similarly, as for adding a new metrology apparatus, adding a new application requires that the substrates W and applications used for the initial training should be representative and the new application should not deviate significantly from the applications used for the initial training. The requirement of similarity of tools or applications only applies to the similarity of the properties of the detected representations (measured signals) obtained by the metrology apparatuses. In case of applications, it does in no case imply that new materials, or new profile shapes require a retraining if the properties of the detected representations remain sufficiently similar to detected representations used in the initial training.

Figure 7:
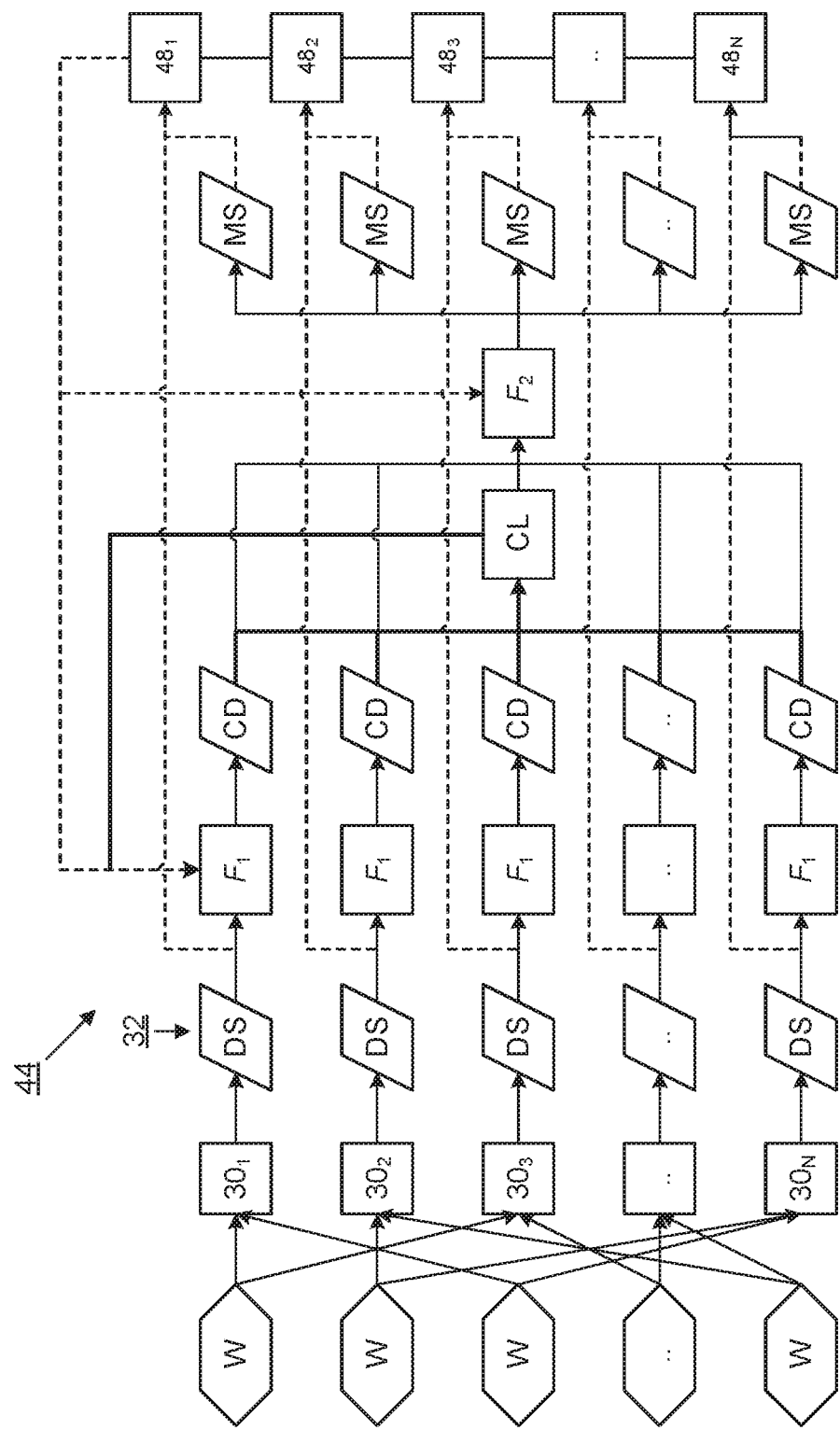
FIG. 7 depicts a variation of the network of FIG. 6 in which a classifier operates on encoded representations output by the encoders.

FIG. 7 depicts a variation on the network 44 depicted in FIG. 6. In this embodiment, the classifier CL operates on the encoded representations CD output from the encoders $F_1$ instead of the datasets MS from the decoder $F_2$. Since the decoder $F_2$ is common and adds no metrology apparatus specific information, this embodiment performs similarly to the embodiment of FIG. 6. In further variations, the encoded representations output from the encoders $F_1$ or the datasets MS output from the decoder $F_2$ may be preprocessed before being supplied to the classifier CL.

Figure 8:
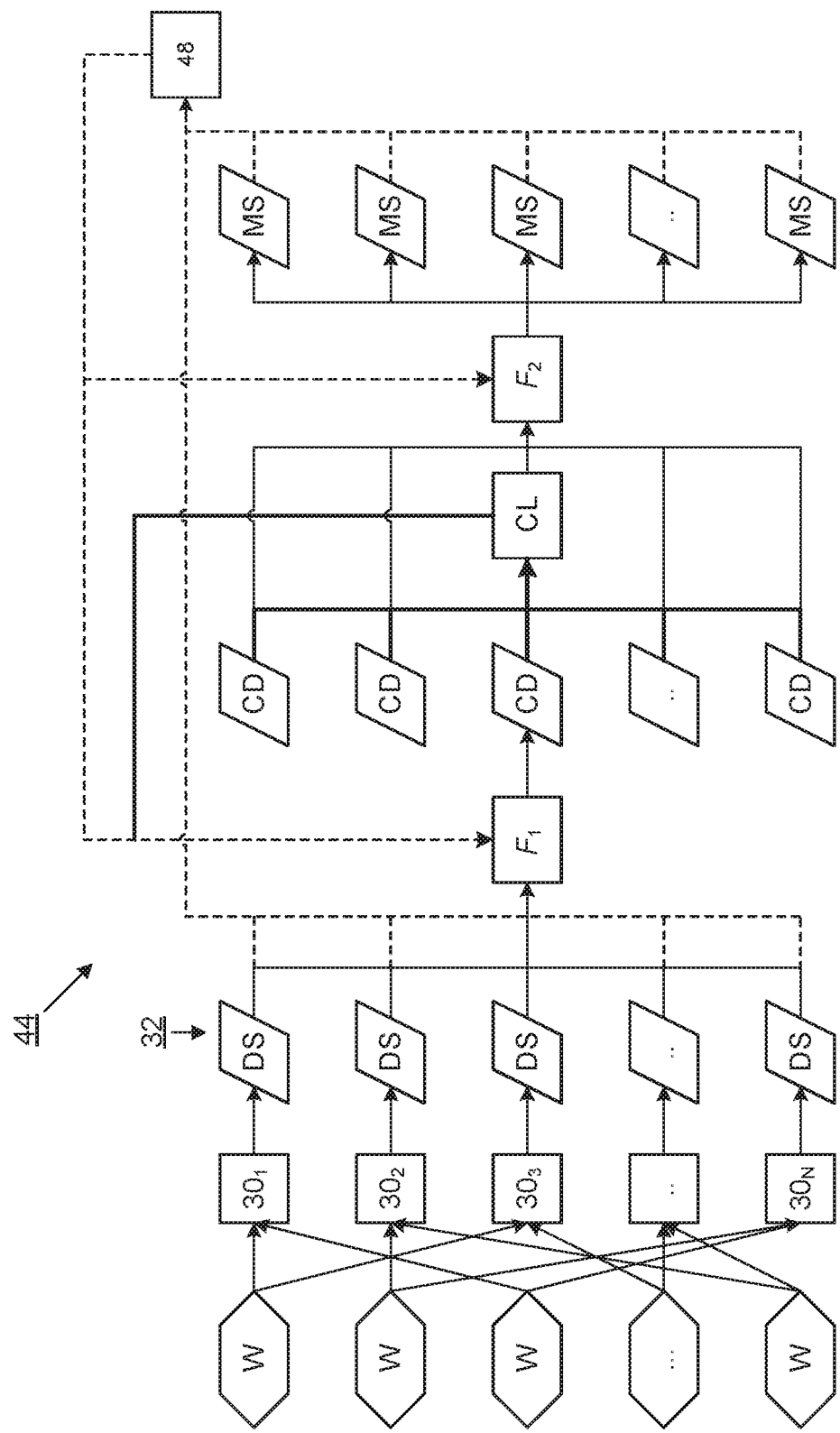
FIG. 8 depicts an example adversarial network having a shared encoder and a shared decoder.

FIG. 8 depicts a further variation on the network 44 depicted in FIG. 6 or 7, in which a single encoder $F_1$ is provided instead of multiple metrology apparatus specific encoders $F_1$. A single comparator 48 is also provided instead of having multiple metrology apparatus specific comparators $48_1$-$48_N$.

In a further variation on any of the networks 44 depicted in FIG. 6-8, the single decoder $F_2$ may be replaced with multiple metrology apparatus specific decoders $F_2$. This approach provides further degrees of freedom to achieve matching between the different metrology apparatuses $30_1$-$30_N$.

In a further variation on any of the networks 44 discussed above, the encoder $F_1$ or encoders $F_1$ may be configured to operate on detected representations that have not been normalized relative to the raw measurement data obtained by the detector 4. This approach may be desirable, for example, in a model-based approach in which the model is so incomplete or ill-calibrated that the normalization process adds metrology apparatus to metrology apparatus differences in a complex fashion rather than removing them.

Figure 9:
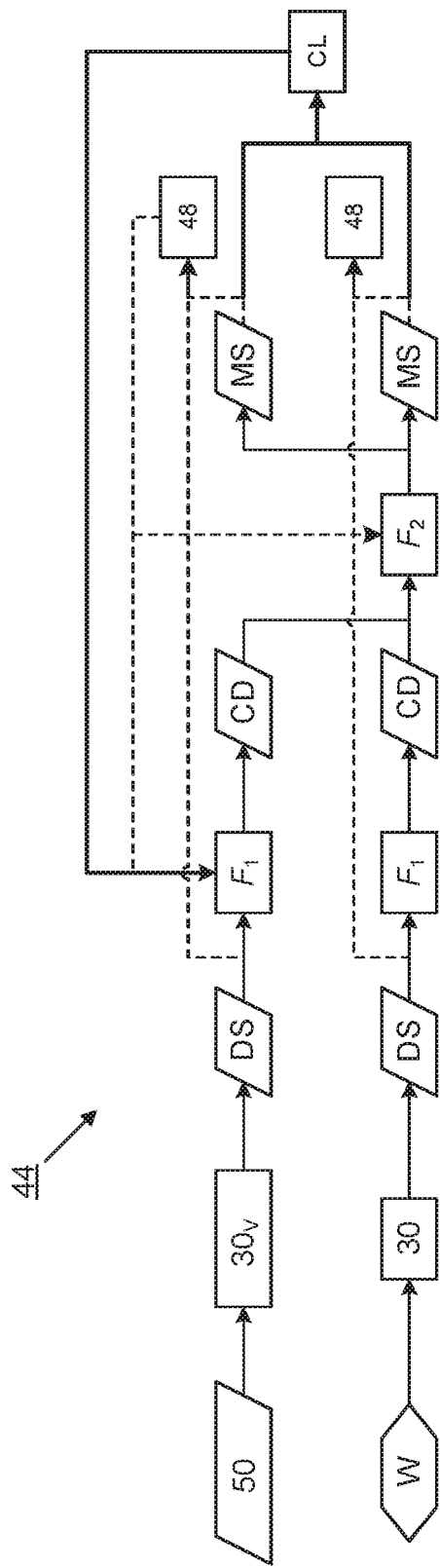
FIG. 9 depicts an arrangement for training based on simulations from a virtual metrology apparatus.

In any of the embodiments discussed above, an initial training of the first machine learning process 41 and the second machine learning process 42 may be performed using detected representations obtained from a set of metrology apparatuses $30_1$-$30_N$ over a set of representative applications. In an alternative approach, a selected one metrology apparatus may be used as a reference for training other metrology apparatuses to achieve matching to the reference metrology apparatus. This training may be performed using a transfer-learning technique. In an embodiment, as depicted in FIG. 9, a virtual metrology apparatus $30_V$ is used as the reference. Training target profiles 50 are provided to the virtual metrology apparatus $30_V$. Simulation of measurement of the training target profiles by the virtual metrology apparatus $30_V$ provides datasets DS to be input to the encoder $F_1$ to provide encoded representations CD. This approach may improve the accuracy of the metrology apparatus 30. It is desirable that the training target profiles 50 used for simulation, at least for parameters of interest, cover the distribution of the actual substrates W to be measured, since all differences will be detected by the classifier CL and used to train the encoder/decoder combination to remove these differences from the encoded representation.

Methods of calibrating metrology apparatuses described herein are particularly effective where the state of the metrology apparatuses is stable and/or where normalization methods sufficiently suppress drift in the metrology apparatuses. The training of the network 44 may be updated online as data becomes available to reduce the effect of drift. The training of the network 44 may also be adapted to deal with expected changes in environmental conditions such as temperature, for example by including training data obtained at different temperatures.

In an embodiment, a method of determining a parameter of interest relating to a structure on a substrate W formed by a lithographic process is provided. The method comprises calibrating a plurality of metrology apparatuses $30_1$-$30_N$ using any of the methods of calibration described above. The method further comprises receiving input data representing a detected representation of radiation scattered from the structure and detected by one of the metrology apparatuses $30_1$-$30_N$. The method further comprises using either or both of the encoder $F_1$ and decoder $F_2$, after the training by the first machine learning process 41, to obtain the parameter of interest from the received input data.

In an embodiment, a metrology apparatus $30_1$-$30_N$ is provided for determining a parameter of interest relating to a structure on a substrate W formed by a lithographic process. The metrology apparatus $30_1$-$30_N$ is calibrated using any of the methods of calibration described above. The metrology apparatus $30_1$-$30_N$ further comprises a processing unit PU that receives input data representing a detected representation of radiation scattered from the structure and detected by the metrology apparatus $30_1$-$30_N$. The metrology apparatus $30_1$-$30_N$ uses either or both of the encoder $F_1$ and decoder $F_2$, after the training by the first machine learning process 41, to obtain the parameter of interest from the received input data.

The methods described above may be computer-implemented. Each step of the disclosed methods may therefore be performed by a computer. The computer may comprise various combinations of computer hardware, including for example CPUs, RAM, SSDs, motherboards, network connections, firmware, software, and/or other elements known in the art that allow the computer hardware to perform the required computing operations. The required computing operations may be defined by one or more computer programs. The one or more computer programs may be provided in the form of media, optionally non-transitory media, storing computer readable instructions. When the computer readable instructions are read by the computer, the computer performs the required method steps.

Further embodiments according to the present invention are described in below numbered clauses:

1. A method of calibrating a plurality of metrology apparatuses, comprising:
   obtaining training data comprising, for each of the metrology apparatuses, a plurality of detected representations of radiation scattered from a structure on a substrate and detected by the metrology apparatus;
   providing an encoder configured to encode each detected representation to provide an encoded representation, and a decoder configured to generate a synthetic detected representation from the respective encoded representation;

providing a classifier configured to estimate from which metrology apparatus originates each encoded representation or each synthetic detected representation; and using the training data to simultaneously perform:

a first machine learning process in which either or both of the encoder and decoder are trained to 1) minimize differences between the detected representations and corresponding synthetic detected representations, and 2) minimize a probability of the classifier correctly identifying from which metrology apparatus originates each encoded representation or each synthetic detected representation; and a second machine learning process in which the classifier is trained to maximize the probability of the classifier correctly identifying from which metrology apparatus originates each encoded representation or each synthetic detected representation.

2. The method of any preceding clause, wherein:

the encoder is configured to derive one or more target parameters of a geometrical model of the structure on the substrate; and the decoder is configured to simulate scattering of radiation from the structure and detection of the detected representation by the metrology apparatus based on the geometrical model of the structure and a metrology recipe defining settings of the metrology apparatus.

3. The method of clause 2, wherein the training of the first machine learning process comprises adjusting one or more parameters defining the geometrical model.

4. The method of clause 2 or 3, wherein the training of the first machine learning process comprises adjusting one or more parameters defining the metrology recipe.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). It is also to be noted that the term metrology apparatus or metrology system encompasses or may be substituted with the term inspection apparatus or inspection system. A metrology or inspection apparatus as disclosed herein may be used to detect defects on or within a substrate and/or defects of structures on a substrate. In such an embodiment, a parameter of the structure on the substrate may relate to defects in the structure, the absence of a specific part of the structure, or the presence of an unwanted structure on the substrate, for example.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. With respect to the multi-sensitivity target embodiment, the different product features may comprise many regions with varying sensitivities (varying pitch etc.). Further, pitch p of the metrology targets is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of calibrating a plurality of metrology apparatuses, comprising:

obtaining training data comprising, for each of the metrology apparatuses, a plurality of detected representations of radiation scattered from a structure on a substrate and detected by the metrology apparatus;

encoding, using an encoder, each detected representation to provide an encoded representation, and generating, using a decoder, a synthetic detected representation from the respective encoded representation;

identify, using a classifier, a metrology apparatus from the plurality of metrology apparatuses that originates each encoded representation or each synthetic detected representation; and using the training data to simultaneously perform:

a first machine learning process in which either or both of the encoder and decoder are trained to 1) minimize differences between the detected representations and corresponding synthetic detected representations, and 2) minimize a probability of the classifier correctly identifying from which metrology apparatus each encoded representation or each synthetic detected representation originates; and a second machine learning process in which the classifier is trained to maximize the probability of the classifier correctly identifying from which metrology apparatus each encoded representation or each synthetic detected representation originates.

2. The method of claim 1, wherein the encoder and decoder comprise a neural network.

3. The method of claim 2, wherein the encoder and decoder form an auto-encoder.

4. The method of claim 2, wherein the encoder and decoder comprise a parametrized filter.

5. The method of claim 4, wherein the training of the first machine learning process comprises adjusting weightings applied by the encoder to respective components of a mathematical expansion representing the detected representation.

6. The method of claim 5, wherein the encoded representation comprises coefficients of the mathematical expansion weighted by the weightings.

7. The method of claim 4, wherein the training of the first machine learning process comprises selecting one or more basis functions of a mathematical expansion representing the detected representation.

8. The method of claim 1, wherein the encoding of each detected representation by the encoder comprises deriving one or more parameters of interest of the structure on the substrate from which the detected representation is obtained by the respective metrology apparatus.

9. The method of claim 1, further comprising:
deriving one or more target parameters of a geometrical model of the structure on the substrate; and
simulating the scattering of radiation from the structure and detection of the detected representation by the metrology apparatus based on the geometrical model of the structure and a metrology recipe defining settings of the metrology apparatus.

10. The method of claim 1, wherein the detected representation comprises a pupil representation defining a distribution of radiation in a pupil plane of the metrology apparatus.

11. The method of claim 1, wherein the first machine learning process and the second machine learning process form a generative adversarial network, with the first machine learning process being adversarial with respect to the second machine learning process, and the decoder acting as a generative model of the generative adversarial network.

12. The method of claim 1, wherein the classifier comprises one or more of the following: neural network, support vector machine, logistic regression, or linear discriminant analysis.

13. A method of determining a parameter of interest relating to a structure on a substrate formed by a lithographic process, comprising:
calibrating a plurality of metrology apparatuses using the method of claim 1;
receiving input data representing a detected representation of radiation scattered from the structure and detected by one of the metrology apparatuses; and
using either or both of the encoder and decoder, after the training by the first machine learning process, to obtain the parameter of interest from the received input data.

14. The method of claim 1, wherein the encoder comprises a comparator; and
wherein the comparator is configured to compare a dataset input to the encoder to a dataset output from the decoder.

15. A metrology apparatus for determining a parameter of interest relating to a structure on a substrate formed by a lithographic process,
wherein the metrology apparatus is a metrology apparatus having been calibrated using the method of claim 1; and
wherein the metrology apparatus comprises:
a processing unit configured to:
receive input data representing a detected representation of radiation scattered from the structure and detected by the metrology apparatus; and
use either or both of the encoder and decoder, after the training by the first machine learning process, to obtain the parameter of interest from the received input data.

16. A non-transitory computer program product comprising machine-readable instructions for causing a processing unit to cause the performance of the method of claim 1.

17. The method of claim 1, further comprising:
mapping, by the classifier, an output of the encoder and/or the decoder to a probability, for each given one of the plurality of metrology apparatuses, that the output originated from that metrology apparatus.

18. The method of claim 17, wherein the probability is represented as a penalty in a cost function of the encoder and the decoder.

19. The method of claim 13, further comprising:
adding an additional metrology apparatus to the plurality of metrology apparatuses; and
training another encoder based on the trained encoder.

* * * * *